US012579023B2

(12) United States Patent
Liu et al.

(10) Patent No.: US 12,579,023 B2
(45) Date of Patent: Mar. 17, 2026

(54) ENHANCED ERROR HANDLING IN MEMORY SYSTEMS

(71) Applicant: Micron Technology, Inc., Boise, ID (US)

(72) Inventors: Jiejuan Liu, Singapore (SG); Yee Yang Tay, Singapore (SG)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 18/789,361

(22) Filed: Jul. 30, 2024

(65) Prior Publication Data

US 2026/0037360 A1 Feb. 5, 2026

(51) Int. Cl.
*G06F 11/07* (2006.01)
*G11C 16/04* (2006.01)
*G11C 16/26* (2006.01)

(52) U.S. Cl.
CPC ........ *G06F 11/0793* (2013.01); *G06F 11/073* (2013.01); *G11C 16/26* (2013.01); *G11C 16/0483* (2013.01)

(58) Field of Classification Search
CPC .... G06F 11/0793; G06F 11/073; G11C 16/26; G11C 16/0483
See application file for complete search history.

(56) References Cited

U.S. PATENT DOCUMENTS

| | | | | |
|---|---|---|---|---|
| 9,761,308 | B1 * | 9/2017 | Cometti | G11C 29/50004 |
| 11,335,429 | B1 * | 5/2022 | Hu | G11C 29/52 |
| 2018/0061510 | A1 * | 3/2018 | Han | G11C 16/10 |
| 2019/0172542 | A1 * | 6/2019 | Miladinovic | G06F 11/076 |
| 2020/0210259 | A1 * | 7/2020 | Hoei | G11C 16/3418 |
| 2021/0012857 | A1 * | 1/2021 | Xie | G11C 29/50004 |
| 2021/0407598 | A1 * | 12/2021 | Goode | G11C 16/28 |
| 2023/0187011 | A1 * | 6/2023 | Lee | G11C 29/022 |
| | | | | 365/185.09 |
| 2024/0012569 | A1 * | 1/2024 | Kang | G06F 3/0619 |
| 2024/0233813 | A1 * | 7/2024 | Guo | G11C 16/26 |

OTHER PUBLICATIONS

Kingma, D. P., & Ba, J. (2014). Adam: "A method for stochastic optimization" arXiv preprint arXiv:1412.6980.

* cited by examiner

*Primary Examiner* — Robert W Beausoliel, Jr.
(74) *Attorney, Agent, or Firm* — Holland & Hart LLP

(57) ABSTRACT

Methods, systems, and devices for enhanced error handling in memory systems are described. A memory system may enter a read error handling procedure to recover data from a memory cell. For example, the memory system may perform multiple read operations at respective first read levels to identify a voltage valley associated with the data in the memory cell. Based on identifying the voltage valley, the memory system may read the data from the memory cell according to a second read level, where the second read level may be based on one of the first read levels, a first learning rate parameter, and a first momentum parameter. The memory system may determine whether to exit the error handling procedure or continue with the error handling procedure based on whether the data was successfully decoded in response to the read operation at the second read level.

21 Claims, 5 Drawing Sheets

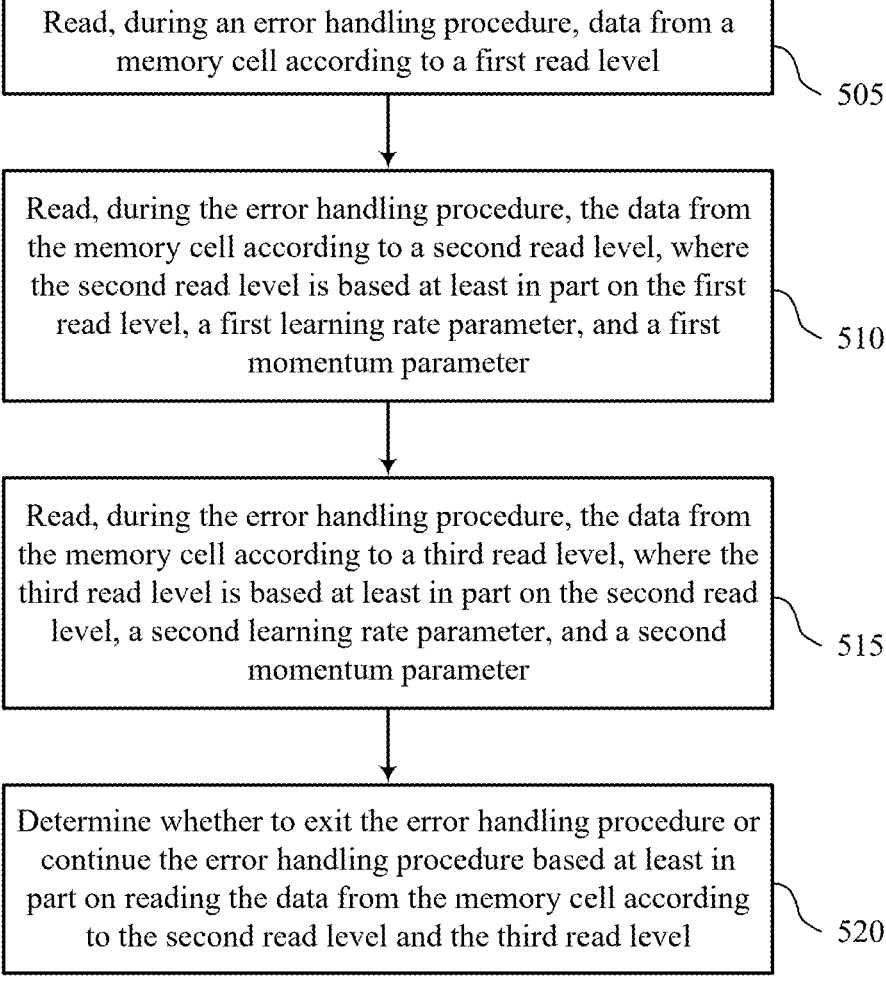

Read, during an error handling procedure, data from a memory cell according to a first read level

505

Read, during the error handling procedure, the data from the memory cell according to a second read level, where the second read level is based at least in part on the first read level, a first learning rate parameter, and a first momentum parameter

510

Read, during the error handling procedure, the data from the memory cell according to a third read level, where the third read level is based at least in part on the second read level, a second learning rate parameter, and a second momentum parameter

515

Determine whether to exit the error handling procedure or continue the error handling procedure based at least in part on reading the data from the memory cell according to the second read level and the third read level

ENHANCED ERROR HANDLING IN MEMORY SYSTEMS

TECHNICAL FIELD

The following relates to one or more systems for memory, including enhanced error handling in memory systems.

BACKGROUND

Memory devices are widely used to store information in devices such as computers, user devices, wireless communication devices, cameras, digital displays, and others. Information is stored by programming memory cells within a memory device to various states. For example, binary memory cells may be programmed to one of two supported states, often denoted by a logic 1 or a logic 0. In some examples, a single memory cell may support more than two states, any one of which may be stored. To access the stored information, the memory device may read (e.g., sense, detect, retrieve, determine) states from the memory cells. To store information, the memory device may write (e.g., program, set, assign) states to the memory cells.

Various types of memory devices exist, including magnetic hard disks, random access memory (RAM), read-only memory (ROM), dynamic RAM (DRAM), synchronous dynamic RAM (SDRAM), static RAM (SRAM), ferroelectric RAM (FeRAM), magnetic RAM (MRAM), resistive RAM (RRAM), flash memory, phase change memory (PCM), self-selecting memory, chalcogenide memory technologies, not- or (NOR) and not-and (NAND) memory devices, and others. Memory cells may be described in terms of volatile configurations or non-volatile configurations. Memory cells configured in a non-volatile configuration may maintain stored logic states for extended periods of time even in the absence of an external power source. Memory cells configured in a volatile configuration may lose stored states when disconnected from an external power source.

BRIEF DESCRIPTION OF THE DRAWINGS

FIG. 5 shows a flowchart illustrating a method or methods that support enhanced error handling in memory systems in accordance with examples as disclosed herein.

DETAILED DESCRIPTION

Figure 1:
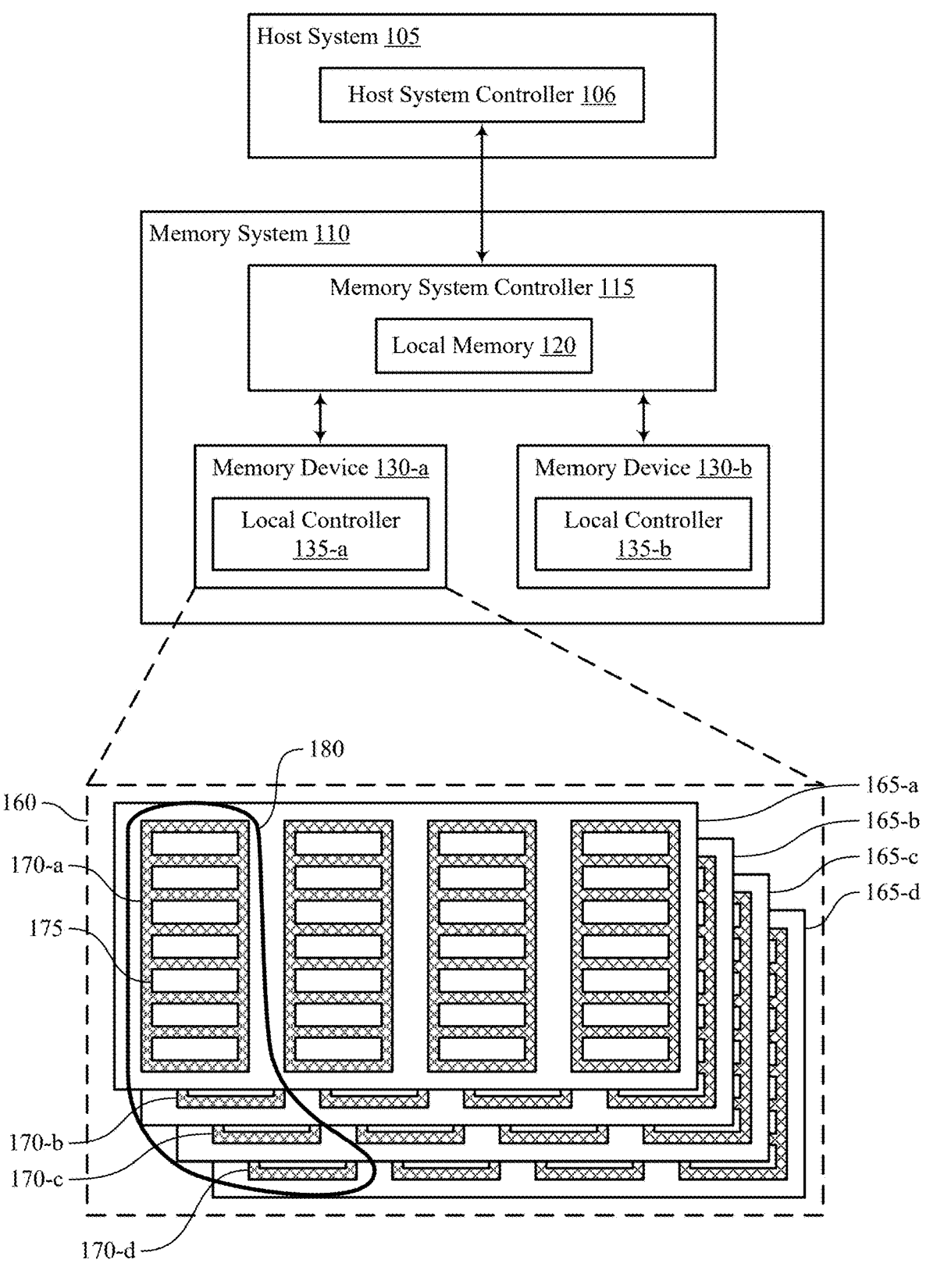
FIG. 1 shows an example of a system that supports enhanced error handling in memory systems in accordance with examples as disclosed herein.

In some cases, due to one or more factors, memory cells of a memory system (e.g., not-AND (NAND) systems) may degrade over time, resulting in the memory system performing various procedures to correct, and in some cases, recover data stored in the memory cells. In such cases, to recover data stored at a memory cell, the memory system may perform one or more read operations to identify a read level (e.g., threshold voltage level, read offset, or read position) associated with the memory cell. In one example, the memory system may perform an increased quantity of read operations, each at a respective read level, on the memory cell to identify the accurate read level and recover the data from the memory cell. However, while such operations may accurately obtain the read level, by performing the increased quantity of read operations, the memory system may experience increased latency, thereby preventing the memory system from performing additional access operations efficiently. In another example, the memory system may perform multiple read operations at the memory cell, where a read level at each read operation may be adjusted by a predefined value (e.g., a predefined gap). Accordingly, the memory system may obtain a histogram of information read out from the memory cell at each read level, identify the accurate read level according to the histogram, and recover the data from the memory cell. However, while such operations may involve reduced read operations relative to other recovery operations, by adjusting subsequent read levels according to the predefined value, the memory system may periodically overshoot the accurate read level, resulting in increased latency and reduced efficiency.

The techniques, methods, and devices described herein may enable the memory system to incrementally adjust the read levels applied to the memory cell based on information associated with previous read levels applied to the memory cell, which may increase efficiency in recovering the data and reduce latency, among other advantages. For example, in response to failing to read data from a memory cell, the memory system may initialize an error handling procedure to recover the data. In such examples, the memory system may read the memory cell according to one or more first read levels to identify a voltage valley (e.g., a series or set of voltages between two voltage distributions) associated with the data at the memory cell. Based on identifying the valley, the memory system may read the memory cell according to a second read voltage, where the second read voltage may be based on the one or more first read levels, a first learning rate parameter, and a first momentum parameter.

Based on reading the memory cell, the memory system may determine whether the data read from the first memory according to the second read level is decodable, and if so, may exit the error handling procedure having recovered the data. Alternatively, if the memory system determines that the data read from the memory cell is not decodable, the memory system may perform a read operation at the memory cell according to a third read level, where the third read level may be based on the second read level, a second learning rate parameter, and a second momentum parameter. In such examples, the second learning rate parameter and the second momentum parameter may be based on a gradient parameter, where the gradient parameter is calculated as being the difference between a quantity of non-conducting bits (e.g., '0') observed in the data at the first read level and a quantity of non-conducting bits (e.g., '0') observed in the data at the second read level divided by the difference between the first read level and the second read level. As such, the gradient may indicate the quantity of bit flips (e.g., bits that flipped from a '0' to a '1') from the first read level to the second read level. As such, the memory system may determine whether to exit the error handling procedure or continue with the error handling procedure based on whether the data read from the memory cell according to the third read level is decodable. In this way, by iteratively adjusting the read level applied to the memory cell according to information associated with previous read operations (e.g., using previous read levels, gradient values, or the like), the memory system may identify the accurate read level using a reduced quantity of read operations (e.g., relative to some brute force operations) and without overshooting the accurate read level during the operations, which may increase efficiency, reduce latency, and improve user experience in the memory system.

In addition to applicability in memory systems as described herein, techniques for enhanced error handling in memory systems may be generally implemented to improve the performance of various electronic devices and systems (including artificial intelligence (AI) applications, augmented reality (AR) applications, virtual reality (VR) applications, and gaming). Some electronic device applications, including high-performance applications such as AI, AR, VR, and gaming, may be associated with relatively high processing requirements to satisfy user expectations. As such, increasing processing capabilities of the electronic devices by decreasing response times, improving power consumption, reducing complexity, increasing data throughput or access speeds, decreasing communication times, or increasing memory capacity or density, among other performance indicators, may improve user experience or appeal. Implementing the techniques described herein may improve the performance of electronic devices by incrementally adjusting the read level during the error handling procedure based on previous iterations of the error handling procedure, which may decrease latency times associated with the error handling procedure, improve response times, or otherwise improve user experience, among other benefits.

Features of the disclosure are illustrated and described in the context of systems, devices, and circuits. Features of the disclosure are further illustrated and described in the context of flow diagrams, voltage distribution diagrams, and flowcharts.

FIG. 1 shows an example of a system 100 that supports enhanced error handling in memory systems in accordance with examples as disclosed herein. The system 100 includes a host system 105 coupled with a memory system 110. The system 100 may be included in a computing device such as a desktop computer, a laptop computer, a network server, a mobile device, a vehicle, an Internet of Things (IoT) enabled device, an embedded computer (e.g., one included in a vehicle, industrial equipment, or a networked commercial device), or any other computing device that includes memory and a processing device.

A memory system 110 may be or include any device or collection of devices, where the device or collection of devices includes at least one memory array. For example, a memory system 110 may be or include a Universal Flash Storage (UFS) device, an embedded Multi-Media Controller (eMMC) device, a flash device, a universal serial bus (USB) flash device, a secure digital (SD) card, a solid-state drive (SSD), a hard disk drive (HDD), a dual in-line memory module (DIMM), a small outline DIMM (SO-DIMM), or a non-volatile DIMM (NVDIMM), among other devices.

The system 100 may include a host system 105, which may be coupled with the memory system 110. In some examples, this coupling may include an interface with a host system controller 106, which may be an example of a controller or control component configured to cause the host system 105 to perform various operations in accordance with examples as described herein. The host system 105 may include one or more devices and, in some cases, may include a processor chipset and a software stack executed by the processor chipset. For example, the host system 105 may include an application configured for communicating with the memory system 110 or a device therein. The processor chipset may include one or more cores, one or more caches (e.g., memory local to or included in the host system 105), a memory controller (e.g., NVDIMM controller), and a storage protocol controller (e.g., peripheral component interconnect express (PCIe) controller, serial advanced technology attachment (SATA) controller). The host system 105 may use the memory system 110, for example, to write data to the memory system 110 and read data from the memory system 110. Although one memory system 110 is shown in FIG. 1, the host system 105 may be coupled with any quantity of memory systems 110.

The host system 105 may be coupled with the memory system 110 via at least one physical host interface. The host system 105 and the memory system 110 may, in some cases, be configured to communicate via a physical host interface using an associated protocol (e.g., to exchange or otherwise communicate control, address, data, and other signals between the memory system 110 and the host system 105). Examples of a physical host interface may include, but are not limited to, a SATA interface, a UFS interface, an eMMC interface, a PCIe interface, a USB interface, a Fiber Channel interface, a Small Computer System Interface (SCSI), a Serial Attached SCSI (SAS), a Double Data Rate (DDR) interface, a DIMM interface (e.g., DIMM socket interface that supports DDR), an Open NAND Flash Interface (ONFI), and a Low Power Double Data Rate (LPDDR) interface. In some examples, one or more such interfaces may be included in or otherwise supported between a host system controller 106 of the host system 105 and a memory system controller 115 of the memory system 110. In some examples, the host system 105 may be coupled with the memory system 110 (e.g., the host system controller 106 may be coupled with the memory system controller 115) via a respective physical host interface for each memory device 130 included in the memory system 110, or via a respective physical host interface for each type of memory device 130 included in the memory system 110.

The memory system 110 may include a memory system controller 115 and one or more memory devices 130. A memory device 130 may include one or more memory arrays of any type of memory cells (e.g., non-volatile memory cells, volatile memory cells, or any combination thereof). Although two memory devices 130-a and 130-b are shown in the example of FIG. 1, the memory system 110 may include any quantity of memory devices 130. Further, if the memory system 110 includes more than one memory device 130, different memory devices 130 within the memory system 110 may include the same or different types of memory cells.

The memory system controller 115 may be coupled with and communicate with the host system 105 (e.g., via the physical host interface) and may be an example of a controller or control component configured to cause the memory system 110 to perform various operations in accordance with examples as described herein. The memory system controller 115 may also be coupled with and communicate with memory devices 130 to perform operations such as reading data, writing data, erasing data, or refreshing data at a memory device 130—among other such operations—which may generically be referred to as access operations. In some cases, the memory system controller 115 may receive commands from the host system 105 and communicate with one or more memory devices 130 to execute such commands (e.g., at memory arrays within the one or more memory devices 130). For example, the memory system controller 115 may receive commands or operations from the host system 105 and may convert the commands or operations into instructions or appropriate commands to achieve the desired access of the memory devices 130. In some cases, the memory system controller 115 may exchange data with the host system 105 and with one or more memory devices 130 (e.g., in response to or otherwise in association with commands from the host system 105). For example, the memory system controller 115 may convert responses (e.g., data packets or other signals) associated with the memory devices 130 into corresponding signals for the host system 105.

The memory system controller 115 may be configured for other operations associated with the memory devices 130. For example, the memory system controller 115 may execute or manage operations such as wear-leveling operations, garbage collection operations, error control operations such as error-detecting operations or error-correcting operations, encryption operations, caching operations, media management operations, background refresh, health monitoring, and address translations between logical addresses (e.g., logical block addresses (LBAs)) associated with commands from the host system 105 and physical addresses (e.g., physical block addresses) associated with memory cells within the memory devices 130.

The memory system controller 115 may include hardware such as one or more integrated circuits or discrete components, a buffer memory, or a combination thereof. The hardware may include circuitry with dedicated (e.g., hard-coded) logic to perform the operations ascribed herein to the memory system controller 115. The memory system controller 115 may be or include a microcontroller, special purpose logic circuitry (e.g., a field programmable gate array (FPGA), an application specific integrated circuit (ASIC), a digital signal processor (DSP)), or any other suitable processor or processing circuitry.

The memory system controller 115 may also include a local memory 120. In some cases, the local memory 120 may include read-only memory (ROM) or other memory that may store operating code (e.g., executable instructions) executable by the memory system controller 115 to perform functions ascribed herein to the memory system controller 115. In some cases, the local memory 120 may additionally, or alternatively, include static random access memory (SRAM) or other memory that may be used by the memory system controller 115 for internal storage or calculations, for example, related to the functions ascribed herein to the memory system controller 115. Additionally, or alternatively, the local memory 120 may serve as a cache for the memory system controller 115. For example, data may be stored in the local memory 120 if read from or written to a memory device 130, and the data may be available within the local memory 120 for subsequent retrieval for or manipulation (e.g., updating) by the host system 105 (e.g., with reduced latency relative to a memory device 130) in accordance with a cache policy.

Although the example of the memory system 110 in FIG. 1 has been illustrated as including the memory system controller 115, in some cases, a memory system 110 may not include a memory system controller 115. For example, the memory system 110 may additionally, or alternatively, rely on an external controller (e.g., implemented by the host system 105) or one or more local controllers 135, which may be internal to memory devices 130, respectively, to perform the functions ascribed herein to the memory system controller 115. In general, one or more functions ascribed herein to the memory system controller 115 may, in some cases, be performed instead by the host system 105, a local controller

135, or any combination thereof. In some cases, a memory device 130 that is managed at least in part by a memory system controller 115 may be referred to as a managed memory device. An example of a managed memory device is a managed NAND (MNAND) device.

A memory device 130 may include one or more arrays of non-volatile memory cells. For example, a memory device 130 may include NAND (e.g., NAND flash) memory, ROM, phase change memory (PCM), self-selecting memory, other chalcogenide-based memories, ferroelectric random access memory (FeRAM), magneto RAM (MRAM), NOR (e.g., NOR flash) memory, Spin Transfer Torque (STT)-MRAM, conductive bridging RAM (CBRAM), resistive random access memory (RRAM), oxide based RRAM (OxRAM), electrically erasable programmable ROM (EEPROM), or any combination thereof.

Additionally, or alternatively, a memory device 130 may include one or more arrays of volatile memory cells. For example, a memory device 130 may include RAM memory cells, such as dynamic RAM (DRAM) memory cells and synchronous DRAM (SDRAM) memory cells.

In some examples, a memory device 130 may include (e.g., on the same die, within the same package) a local controller 135, which may execute operations on one or more memory cells of the respective memory device 130. A local controller 135 may operate in conjunction with a memory system controller 115 or may perform one or more functions ascribed herein to the memory system controller 115. For example, as illustrated in FIG. 1, a memory device 130-a may include a local controller 135-a and a memory device 130-b may include a local controller 135-b. A local controller 135 may be or include a microcontroller, special purpose logic circuitry (e.g., a field programmable gate array (FPGA), an application specific integrated circuit (ASIC), a digital signal processor (DSP)), or any other suitable processor or processing circuitry.

In some cases, a memory device 130 may be or include a NAND device (e.g., NAND flash device). A memory device 130 may be or include a die 160 (e.g., a memory die). For example, in some cases, a memory device 130 may be a package that includes one or more dies 160. A die 160 may, in some examples, be a piece of electronics-grade semiconductor cut from a wafer (e.g., a silicon die cut from a silicon wafer). Each die 160 may include one or more planes 165, and each plane 165 may include a respective set of blocks 170, where each block 170 may include a respective set of pages 175, and each page 175 may include a set of memory cells.

In some cases, a NAND memory device 130 may include memory cells configured to each store one bit of information, which may be referred to as single level cells (SLCs). Additionally, or alternatively, a NAND memory device 130 may include memory cells configured to each store multiple bits of information, which may be referred to as multi-level cells (MLCs) if configured to each store two bits of information, as tri-level cells (TLCs) if configured to each store three bits of information, as quad-level cells (QLCs) if configured to each store four bits of information, or more generically as multiple-level memory cells. Multiple-level memory cells may provide greater density of storage relative to SLC memory cells but may, in some cases, involve narrower read or write margins or greater complexities for supporting circuitry.

In some cases, planes 165 may refer to groups of blocks 170 and, in some cases, concurrent operations may be performed on different planes 165. For example, concurrent operations may be performed on memory cells within different blocks 170 so long as the different blocks 170 are in different planes 165. In some cases, an individual block 170 may be referred to as a physical block, and a virtual block 180 may refer to a group of blocks 170 within which concurrent operations may occur. For example, concurrent operations may be performed on blocks **170-*a*, 170-*b*, 170-*c*, and 170-*d* that are within planes 165-*a*, 165-*b*, 165-*c*, and 165-*d*, respectively, and blocks 170-*a*, 170-*b*, 170-*c*, and 170-*d* may be collectively referred to as a virtual block 180. In some cases, a virtual block may include blocks 170 from different memory devices 130 (e.g., including blocks in one or more planes of memory device 130-*a* and memory device 130-*b*). In some cases, the blocks 170 within a virtual block may have the same block address within their respective planes 165 (e.g., block 170-*a* may be "block 0" of plane 165-*a*, block 170-*b* may be "block 0" of plane 165-*b*, and so on). In some cases, performing concurrent operations in different planes 165 may be subject to one or more restrictions, such as concurrent operations being performed on memory cells within different pages 175 that have the same page address within their respective planes 165 (e.g., related to command decoding, page address decoding circuitry, or other circuitry being shared across planes 165**).

In some cases, a block 170 may include memory cells organized into rows (pages 175) and columns (e.g., strings, not shown). For example, memory cells in the same page 175 may share (e.g., be coupled with) a common word line, and memory cells in the same string may share (e.g., be coupled with) a common digit line (which may alternatively be referred to as a bit line).

For some NAND architectures, memory cells may be read and programmed (e.g., written) at a first level of granularity (e.g., at a page level of granularity, or portion thereof) but may be erased at a second level of granularity (e.g., at a block level of granularity). That is, a page 175 may be the smallest unit of memory (e.g., set of memory cells) that may be independently programmed or read (e.g., programed or read concurrently as part of a single program or read operation), and a block 170 may be the smallest unit of memory (e.g., set of memory cells) that may be independently erased (e.g., erased concurrently as part of a single erase operation). Further, in some cases, NAND memory cells may be erased before they can be re-written with new data. Thus, for example, a used page 175 may, in some cases, not be updated until the entire block 170 that includes the page 175 has been erased.

In some cases, due to one or more factors, memory cells of the memory system 110 may degrade over time, resulting in the memory system 110 performing various procedures to correct, and in some cases, recover data stored in the memory cells. In such cases, to recover data stored at a memory cell, the memory system 110 may perform one or more read operations to identify a read level (e.g., threshold voltage level, read offset, or read position) associated with the memory cell. In one example, the memory system 110 may perform an increased quantity of read operations, each at a respective read level, on the memory cell to identify the accurate read level and recover the data from the memory cell. Such recover operations may be referred to as brute force methods due to the increased quantity of read levels applied to the memory cell. However, while such operations may accurately obtain the read level, by performing the increased quantity of read operations, the memory system 110 may experience increased latency, thereby preventing the memory system 110 from performing additional access operations efficiently. In another example, the memory system 110 may perform multiple read operations at the memory cell, where a read level at each read operation may be adjusted by a predefined value (e.g., a predefined gap). Accordingly, the memory system 110 may obtain a histogram of information read out from the memory cell at each read level, identify the accurate read level according to the histogram, and recover the data from the memory cell.

As an illustrative example, the memory system 110 may perform a first read operation at a first read level (e.g., '3'), sense a first value (e.g., bit value) from the memory cell, and determine a first quantity of bit flips in the first value relative to a previous sensed value. Based on performing the first read operation, the memory system 110 may perform a second read operation at a second read level (e.g., −4), where the second read level may be adjusted from the first read level by a predefined value (e.g., a predefined fixed gap of 7). The memory system 110 may sense a second value from the memory cell and determine a second quantity of bit flips in the sensed value relative to the first value. The memory system 110 may proceed to read the memory cell according to a third read level (e.g., 10), where the third read level may be adjusted from the first read level by the predefined value (e.g., 7). As such, the memory system 110 may sense a third value from the memory cell and determine the quantity of bit flips that occurred in the third value relative to the second value. The memory system 110 may proceed to perform such operations, using various read levels adjusted by the predefined fixed gap value (e.g., −11, −18, −29, −9, among other examples) and identify the associated quantity of bit flips.

The memory system 110 may construct a histogram of the quantity of bit flips that occurred in the sensed values, where the memory system 110 may identify the accurate read level and exit the error handling procedure based on identifying a shape of the histogram. In some examples, the memory system 110 may search for a high, low, high shape of the histogram, where the memory system may identify the read level corresponding to the low portion of the histogram shape (e.g., the read level corresponding to the quantity of bit flips associated with the low shape) as the accurate read level. Alternatively, the memory system 110 may search for a high, low, low, high shape of the histogram, where the memory system 110 may identify the read level corresponding to one of the two low portions of the histogram as the accurate read level. In some examples, the memory system 110 may search for a low, low, low shape, where the memory system 110 may identify the read level corresponding to one of the three low portions of the histogram as the accurate read level. In this way, the memory system 110 may identify the accurate read level and recover the data.

However, while such operations may involve reduced read operations relative to other recovery operations, by adjusting subsequent read levels according to the predefined value, the memory system 110 may periodically overshoot the accurate read level, resulting in increased latency and reduced efficiency. For example, as described in the illustrative example above, the memory system 110 may determine that interpolation (e.g., estimation of the read level over the received data points) occurs at a read level of −9. As such, because the memory system 110 bypassed the read level of −9 and performed an additional three read operations with a fixed step of 7 (e.g., the operations at read levels −11, −18, and −25), the memory system 110 may experience increased latency, reduced efficiency in error handling, among other disadvantages. Thus, techniques to improve the error handling at the memory system 110 and reduce the calibration loops (e.g., multiple read operations) may be desired to improve efficiency.

The techniques, methods, and devices described herein may enable the memory system 110 (e.g., via the memory system controller 115) to incrementally adjust the read levels applied to the memory cell based on information associated with previous read levels applied to the memory cell, which may increase efficiency in recovering the data and reduce latency, among other advantages. For example, in response to failing to read data from a memory cell, the memory system 110 may initialize an error handling procedure to recover the data. In such examples, the memory system 110 may read the memory cell according to one or more first read levels to identify a voltage valley (e.g., a series or set of voltages between two voltage distributions) associated with the data at the memory cell. Based on identifying the valley, the memory system 110 may read the memory cell according to a second read voltage, where the second read voltage may be based on the one or more first read levels, a first learning rate parameter, and a first momentum parameter.

Based on reading the memory cell, the memory system 110 may determine whether the data read from the first memory according to the second read level is decodable, and if so, may exit the error handling procedure having recovered the data. Alternatively, if the memory system 110 determines that the data read from the memory cell is not decodable, the memory system 110 may perform a read operation at the memory cell according to a third read level, where the third read level may be based on the second read level, a second learning rate parameter, and a second momentum parameter. In such examples, the second learning rate parameter and the second momentum parameter may be based on a gradient parameter, where the gradient parameter is calculated as being the difference between a quantity of non-conducting bits (e.g., '0") observed in the data (e.g., sensed value) at the first read level and a quantity of non-conducting bits (e.g., '0') observed in the data (e.g., sensed value) at the second read level divided by the difference between the first read level and the second read level. In other words, the gradient value may be an indication of a quantity of bit flips (e.g., from non-conducting bits '0' to conducting bits '1') observed in the data between the first read level and the second read level. As such, the memory system 110 may determine whether to exit the error handling procedure or continue with the error handling procedure based on whether the data read from the memory cell according to the third read level is decodable. In this way, by iteratively adjusting the read level applied to the memory cell according to information associated with previous read operations (e.g., using previous read levels, gradient values, or the like), the memory system 110 may identify the accurate read level using a reduced quantity of read operations (e.g., relative to some brute force operations) and without overshooting the accurate read level during the operations, which may increase efficiency, reduce latency, and improve user experience in the memory system 110.

In such examples, the memory system 110 may incorporate one or more elements of an adaptive movement estimation (ADAM) procedure to identify the read level associated with the memory cell and recover the data. The ADAM procedure may enable the memory system 110 to achieve increased reliability in recovering the data while operating in a relatively noisy environment. The memory system 110 may utilize the techniques from the ADAM procedure to calculate adaptive learning rates for one or more parameters, which may enable the memory system 110 to adjust the learning rates of the parameters based on first and second moments of the gradients. Such a dynamic adjustment may reduce the likelihood of the memory system 110 calculating local minima, and instead may enable the memory system 110 to identify the accurate read level. Additionally, by utilizing the ADAM procedure, the memory system 110 may be able to utilize sparse gradients and utilize relatively low quantities of memory to determine the subsequent read level (e.g., utilize less memory in the calculations).

In addition to applicability in memory systems 110 as described herein, techniques for enhanced error handling in memory systems 110 may be generally implemented to improve the performance of various electronic devices and systems (including artificial intelligence (AI) applications, augmented reality (AR) applications, virtual reality (VR) applications, and gaming). Some electronic device applications, including high-performance applications such as AI, AR, VR, and gaming, may be associated with relatively high processing requirements to satisfy user expectations. As such, increasing processing capabilities of the electronic devices by decreasing response times, improving power consumption, reducing complexity, increasing data throughput or access speeds, decreasing communication times, or increasing memory capacity or density, among other performance indicators, may improve user experience or appeal. Implementing the techniques described herein may improve the performance of electronic devices by incrementally adjusting the read level during the error handling procedure based on previous iterations of the error handling procedure, which may decrease latency times associated with the error handling procedure, improve response times, or otherwise improve user experience, among other benefits.

Figure 2:
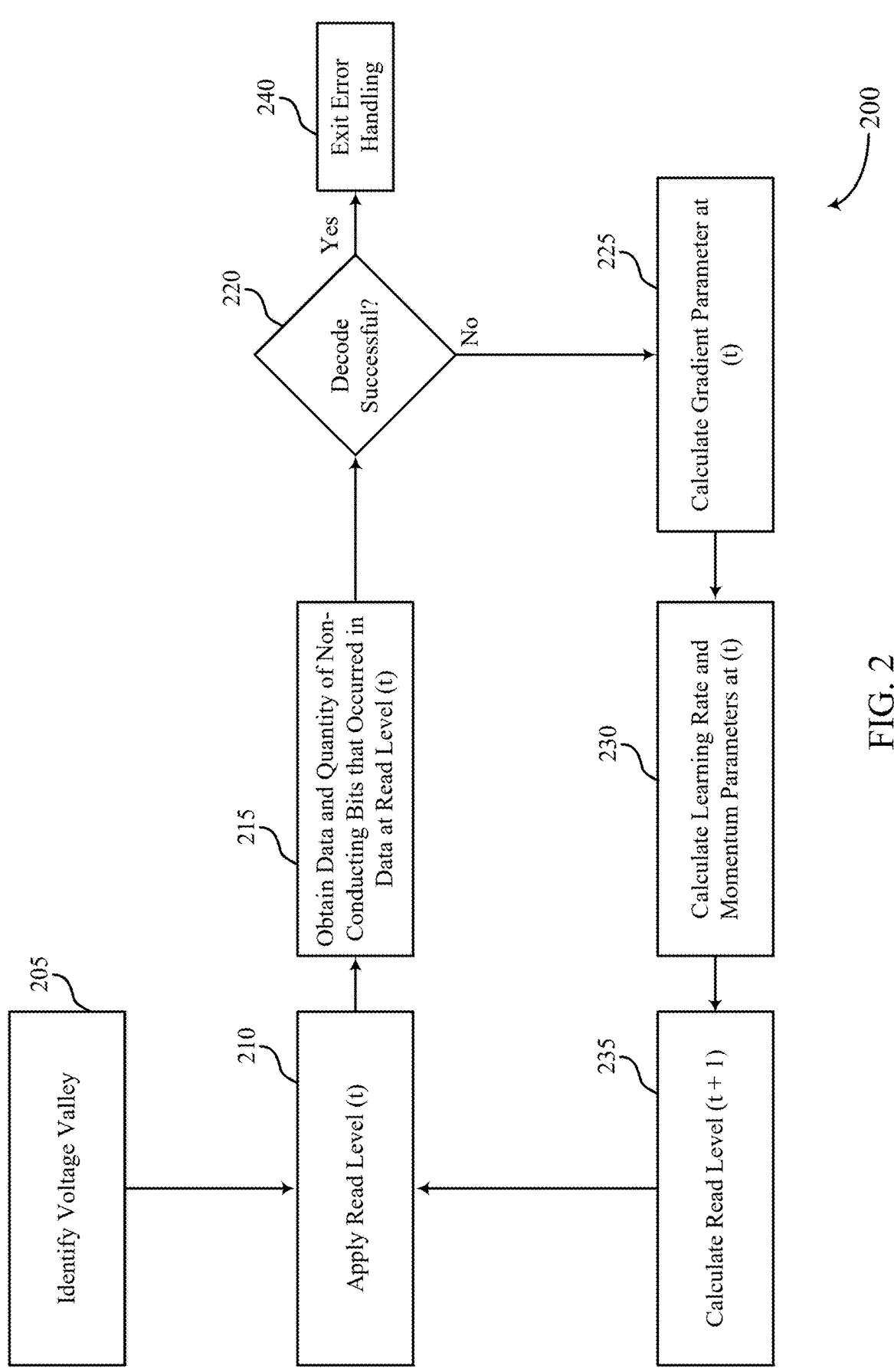
FIG. 2 shows an example of a flow diagram that supports enhanced error handling in memory systems in accordance with examples as disclosed herein.

FIG. 2 shows an example of a flow diagram 200 that supports enhanced error handling in memory systems in accordance with examples as disclosed herein. Aspects of the flow diagram 200 may be implemented by aspects of the system 100. For example, the operations of the flow diagram 200 may be implemented by a memory system 110 (e.g., via the memory system controller 115). In some examples, the aspects of the flow diagram 200 may be implemented as firmware that is stored and executed by the memory system controller 115. The techniques described in the context of the flow diagram 200 may enable the memory system 110 to efficiently recover data in a memory cell by incrementally adjusting the read level applied to the memory cell according to information associated with previous read levels.

In some examples, the memory system 110 may read data from a memory cell (e.g., one or more memory cells in a page 175) by applying a read level (e.g., read voltage, threshold voltage, offset, or position) to the memory cell (e.g., one or more memory cells in a page 175). In such examples, due to various factors, the memory cell (e.g., one or more memory cells in a page 175) may degrade over time, such that the memory system 110 may fail to read the data. Accordingly, the memory system 110 may initialize an error handling procedure based on failing to read the data.

At 205, based on initializing the error handling procedure, the memory system 110 may identify a voltage valley associated with the data at the memory cell (e.g., one or more memory cells in a page 175). A voltage valley may refer to one or more voltages that separate the different logical states of a memory cell. As an illustrative example, in a TLC memory cell, the memory cell may store up to eight possible states, each represented by a different voltage distribution. As such, the voltage valleys may be the points of separation between these voltage distributions. A description of the voltage distributions and valleys may be further described herein with reference to FIG. 3. Accordingly, the memory system 110 may perform one or more read operations (e.g., CFByte or CFBit loops), at various read levels, on the memory cell (e.g., one or more memory cells in a page 175) to identify the correct voltage valley.

In such examples, the memory system 110 may utilize one or more mappings (e.g., look-up tables (LUT)) to identify a read level, read the memory cell (e.g., one or more memory cells in a page 175) according to the identified read level, and determine whether the read level corresponds to the correct voltage valley. For example, the memory system 110 may perform at least two read operations to identify the initial read level associated with the correct voltage valley. In such examples, the memory system 110 may perform a first read operation according to a first read level (e.g., a read level of '0') and identify a first quantity of non-conducting bits in the data read from the memory cell (e.g., one or more memory cells in a page 175) at the first read level. The memory system 110 may perform a second read operation at a second read level, where the second read level may be a predefined initial step from the first read level, based on the LUT (e.g., read levels in the LUT may be based on or associated with an associated non-conducting bit count or CFBit), or both. Based on performing the second read operation, the memory system 110 may determine a second quantity of non-conducting bits in the data read from the memory cell (e.g., one or more memory cells in a page 175) at the second read level.

Based on identifying the correct voltage valley (e.g., via one or more read operations), the memory system 110 may determine (e.g., calculate) the initial read level (for use in the operations at 210) based on the first read level (e.g., offset [t−1]), the first quantity of non-conducting bits (e.g., CFBit [t−1]), the second read level (e.g., offset[t]), the second quantity of non-conducting bits (e.g., CFBit[t]), or any combination thereof according to equations 1-9 as described herein.

At 210, in response to identifying the voltage valley and initial read level at 205, the memory system 110 may read the memory cell (e.g., one or more memory cells in a page 175) according to the initial read level. Alternatively, at 210, the memory system 110 may read the memory cell (e.g., one or more memory cells in a page 175) according to a subsequent read level that is calculated at 235.

At 215, the memory system 110 may obtain data and identify a quantity of non-conducting bits (e.g., '0') that occurred (e.g., were present) in the data read from the memory cell (e.g., one or more memory cells in a page 175) according to the read level at 210. For example, the quantity of non-conducting bits may be referred to as a CFBit count and be a representation of a quantity of zeroes (e.g., '0') in the data read from the memory cell (e.g., one or more memory cells in a page 175) according to the read level. In such examples, the quantity of non-conducting bits may be based on the logical page type (e.g., extra page, lower page, or upper page) associated with the memory cell (e.g., one or more memory cells in a page 175). In some examples, the memory system 110 (or other device, such as the host system 105) may issue a command to calculate the quantity of non-conducting bits (e.g., get CFBit command or get Feature command), where the memory system 110 may also implement and utilize a CFBit circuit to calculate the quantity of non-conducting bits.

As described herein, the quantity of non-conducting bits may be different according to the applied read level. That is, as the memory system 110 applies different read levels to the memory cell (e.g., one or more memory cells in a page 175), the memory system 110 may obtain different (e.g., respective) quantities of non-conducting bits. As an illustrative example, in a page 175 of TLC memory cells, the memory cells may store 18,992 bytes or 151,936 bits, which may be separated into the eight voltage distributions. Accordingly, if the memory system 110 applies a first read level to the page 175 of memory cells (e.g., TLC memory cells), the CFBit circuit of the memory system 110 may calculate a first quantity of non-conducting bits (e.g., 18,992 '0' bits occurred out of the 151,936 bits). Alternatively, if the memory system 110 applies a second read level to the page 175, where the second read level is shifted by 200 millivolts (mV) relative to the first read level, the CFBit circuit of the memory system 110 may calculate a second quantity of non-conducting bits (e.g., 18492 '0' bits occurred out of the 151,936 bits). Similarly, if the memory system 110 applies a third read level to the page 175, where the third read level is shifted by −200 mV relative to the first read level, the CFBit circuit may calculate a third quantity of non-conducting bits (e.g., 19,492 '0' bits occurred out of the 151,936 bits). Accordingly, based on reading the memory cell (or page 175 of memory cells), the memory system 110 may identify the quantity of non-conducting bits in the data.

At 220, the memory system 110 may determine whether the data read from the memory cell (e.g., one or more memory cells in a page 175) at 210 was successfully decoded and obtained. If the memory system 110 determines that the data was successfully decoded, the memory system 110 may proceed to the operations at 240. Alternatively, if the memory system 110 determines that the data was not successfully decoded, the memory system 110 may proceed to the operations at 225.

At 225, the memory system 110 may calculate a gradient parameter, where the memory system 110 may calculate the gradient value may according to Equation 1:

$$\text{gradient}[t] = \Delta CFBit[t]/\Delta offset[t] \tag{1}$$

where $\Delta CFBit$ may represent the quantity of bit flips (e.g., flips from non-conducting bits ('0') to conducting bits ('1')) between two consecutive read levels. For example, the memory system 110 may calculate the $\Delta CFBit$ according to Equation 2:

$$\Delta CFBit[t] = Cfbit[t-1] - Cfbit[t] \tag{2}$$

where Cfbit[t−1] corresponds to the quantity of non-conducting bits in the data read from the memory cell (e.g., one or more memory cells in a page 175) according to a previous read level and Cf bit[t] corresponds to the quantity of non-conducting bits in the data read from the memory cell (e.g., one or more memory cells in a page 175) according to the current read level (e.g., read level applied at 210).

$\Delta offset[t]$ may represent a change between a previous read level and the current read level and be calculated according to Equation 3:

$$\Delta offset[t] = offset[t-1] - offset[t] \tag{3}$$

where offset[t−1] may correspond to the previous read level applied at 210 and offset[t] may correspond to the current read level applied at 210. In such examples, if, at 210, the initial read level (e.g., initial read offset) is applied, the memory system 110 may utilize a quantity of non-conducting bits (e.g., Cf bit[t−1]) and read level (e.g., offset[t−1]) from a read operation that is performed at 205 and occurs immediately prior to the application of the initial read level at 210 to calculate the gradient parameter. Accordingly, the gradient parameter may represent the quantity of bit flips from non-conducting bits (e.g., '0') to conducting bits (e.g., '1') between two consecutive read levels divided by the change between the two consecutive read levels.

At 230, based on obtaining the gradient parameter, the memory system 110 may calculate a current momentum parameter (e.g., $m_t$ exponentially weighted average of previous gradients) and a current squared gradient parameter (e.g., $v_t$, exponential moving average of the squared gradients, root mean square propagation parameter). For example, the memory system 110 may calculate the current momentum parameter according to Equation 4:

$$m_t = \text{beta}_1 * m_{t-1} + (1 - \text{beta}_1) * \text{gradient}_t \tag{4}$$

where $\text{beta}_1$ may correspond to a first decay rate (e.g., 0.9), $m_{t-1}$ may correspond to the momentum parameter associated with a previous read level, and $\text{gradient}_t$ may correspond to the gradient parameter calculated at 225. In such examples, if, at 210, the initial read level was applied, the memory system 110 may set $m_{t-1}$ as being equal to '0'.

The memory system may calculate the current squared gradient parameter according to Equation 5:

$$v_t = \text{beta}_2 * v_{t-1} + (1 - \text{beta}_2) * \text{gradient}_t^2 \tag{5}$$

where $\text{beta}_2$ may correspond to a second decay rate (e.g., 0.999), $v_{t-1}$ may correspond to a squared gradient parameter associated with a previous read level, and $\text{gradient}_t$ may correspond to the gradient parameter calculated at 225. In such examples, if, at 210, the initial read level was applied, the memory system 110 may set $v_{t-1}$ as being equal to '0'.

Based on obtaining the current momentum parameter and the current squared gradient parameter, the memory system 110 may perform a bias correction operation. For example, the memory system 110 may perform the bias correction for the current momentum parameter according to Equation 6:

$$m_{hat_t} = \frac{m_t}{(1 - \text{beta}_1^t)} \tag{6}$$

Similarly, the memory system 110 may perform the bias correction for the current squared gradient parameter according to Equation 7:

$$v_{hat_t} = \frac{v_t}{(1 - \text{beta}_2^t)} \tag{7}$$

Based on performing the biasing correction for the current squared gradient parameter, the memory system 110 may calculate the learning rate parameter according to Equation 8:

$$LearningRate = \frac{\text{alpha}}{\left(sqrt(v_{hat_t}) + \text{epsilon}\right)} \tag{8}$$

where alpha may represent the step size, $v_{hat_t}$ may represent the bias corrected current squared gradient parameter calculated using equation 7, and epsilon may be an integer value (e.g., $10^{-8}$ or other value) to avoid dividing by 0. As described herein, the current momentum parameter (e.g., $m_{hat_t}$) may be based on smoothed out gradient values (e.g., average of previous gradient values) and the learning rate parameter (e.g., LearningRate) may be based on the magnitude of previous gradient values.

In such example, the first decay parameter (e.g., $\text{beta}_1$), the second decay parameter (e.g., $\text{beta}_2$), the epsilon value, and the step size (e.g., alpha 0.001) may be tunable (e.g., adjustable or configured) to achieve improved convergence to the read level and produce improved noise filtration. For example, the memory system 110 may adjust the step size according to a bit error count, latency of the memory system, distance between the identified quantity of non-conducting bits at 215 and a target quantity of non-conducting bits at the memory cell (e.g., one or more memory cells in a page 175), or any combination thereof. In such examples, the memory system 110 may dynamically adjust such parameters. Alternatively, such parameters may be tuned off-line (e.g., during testing of the memory system 110) and hard coded into firmware.

At 235, the memory system 110 may calculate a subsequent read level (e.g., offset (t+1)) according to the learning rate, the momentum parameter and the read level applied at 210 (e.g., offset (t)). For example, the memory system 110 may calculate the read level according to equation 9:

$$\text{Offset}(t+1) = \text{offset}(t) - \text{LearningRate} * m_{hat_t} \tag{9}$$

In response to calculating the read level at 235, the memory system 110 may read the memory cell (e.g., one or more memory cells in a page 175) according to the calculated read level at 205, identify the quantity of non-conducting bits that occurred in the data read from the memory cell (e.g., one or more memory cells in a page 175) according to the calculated read level at 215, an determine whether the data was successfully decoded at 220. If the data was successfully decoded, the memory system 110 may proceed to the operations at 240. Alternatively, if the data was unsuccessfully decoded at 220, the memory system 110 may calculate an updated gradient parameter at 230 according to the equations 1-3.

In response to calculating the gradient parameter, the memory system 110 may calculate an updated learning rate parameters and momentum parameters at 235 according to equations 4-8. Using the calculated learning rate and momentum parameters, the memory system 110 may calculate a subsequent read level according to equation 9. The memory system 110 may continue to perform the operations 210-235 until the accurate read level is identified and the data is recovered from the memory cell (e.g., one or more memory cells in a page 175). Accordingly, at 240, based on successfully decoding and recovering the data from the memory cell (e.g., one or more memory cells in a page 175), the memory system 110 may exit the error handling flow.

Accordingly, because the quantity of non-conducting bits (e.g., CFBit readouts) identified at 215 are characterized as monotonically decreasing functions, the memory system 110 may utilize the gradients magnitude and direction to shift the read levels. For example, the memory system 110 may utilize the gradient to calculate the learning rate parameter and momentum parameter, thereby adjusting the read level according to the gradients fluctuations. By doing so, the memory system 110 may identify the read level associated with the bottom of the identified voltage valley as the position that displays the minimum difference in consecutive quantity of non-conducing bits (e.g., the minimum quantity of bit flips observed in the data between two read levels), which may increase efficiency in the error handling procedure, reduce latency, improve user experience.

Figure 3:
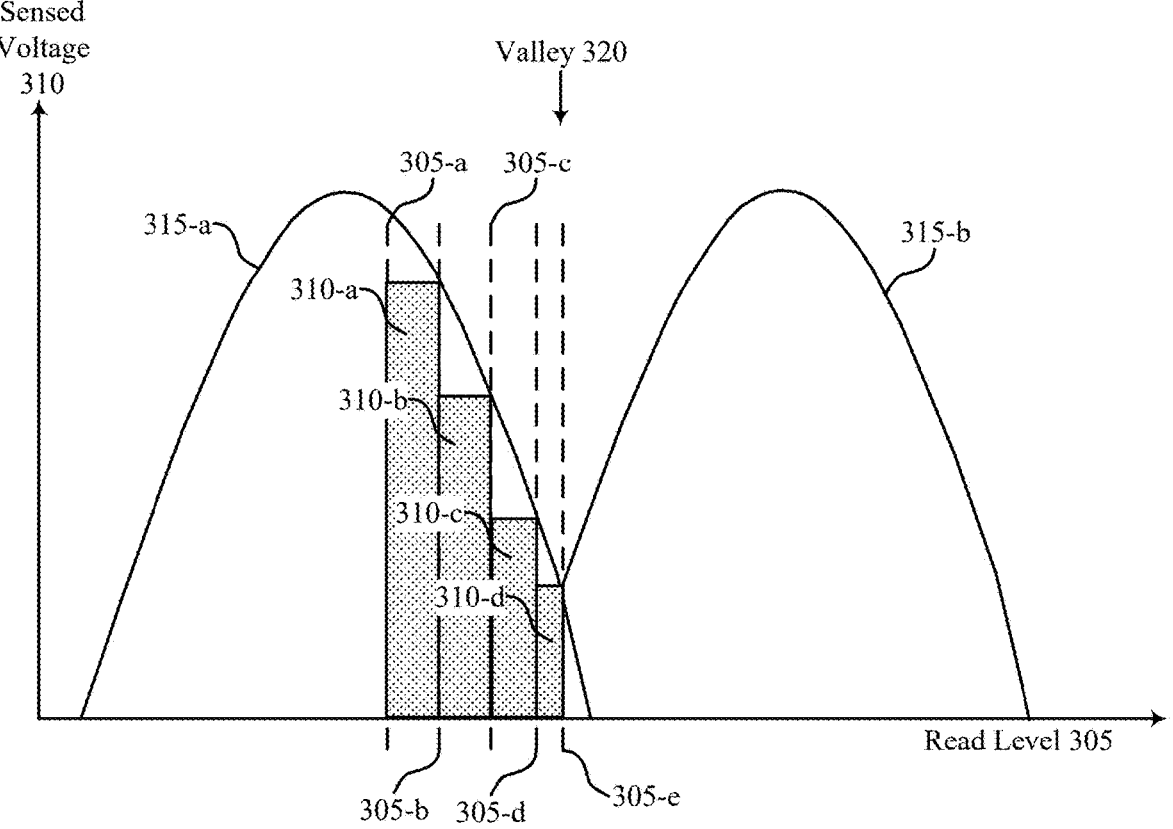
FIG. 3 shows an example of a voltage distribution diagram that supports enhanced error handling in memory systems in accordance with examples as disclosed herein.

FIG. 3 shows an example of a voltage distribution diagram 300 that supports enhanced error handling in memory systems in accordance with examples as disclosed herein. Aspects of the voltage distribution diagram may be implemented by the system 100, the flow diagram 200, or both. For example, the voltage distribution diagram 300 may illustrate two voltage distributions 315, a voltage distribution 315-*a* and a voltage distribution 315-*b*, which may represent different logic states that may be stored by a memory cell (e.g., a MLC, TLC, QLC, among other examples) or one or more memory cells in a page 175 of the memory system 110. The voltage distribution diagram 300 may illustrate incrementally adjusting read levels 305 according to the operations performed at the flow diagram 200 to recover the data from the memory cell.

For example, the memory system 110 may apply a read level 305-*a* (e.g., initial read level) to the memory cell (e.g., one or more memory cells in a page 175) as described herein with reference to the operations at 210 of FIG. 2, where the initial read level 305-*a* may correspond to the voltage valley 320 and be identified as described herein with reference to the operations at 205 of FIG. 2. Based on applying the read level 305-*a*, the memory system 110 may obtain a sensed voltage 310-*a*, which may correspond to a bit value or data, and determine a first quantity of non-conducting bits (e.g., '0') in the data as described herein with reference to the operations at 215. Based on identifying the first quantity of non-conducting bits, the memory system 110 may determine that the data read form the memory cell was not successfully decoded as described herein with reference to the operations at 220 of FIG. 2.

Accordingly, if the data was unsuccessfully decoded, the memory system 110 calculate the gradient parameter as described herein with reference to the operations at 225, calculate the learning rate and momentum parameters according to the techniques described herein with reference to the operations at 230 of FIG. 2. Based on obtaining the learning rate and momentum parameters, the memory system 110 may calculate the read level 305-*b*, in accordance with the techniques described herein with reference to the operations at 235 of FIG. 2.

Based on calculating (e.g., obtaining) the read level 305-*b*, the memory system 110 may apply the read level 305-*b* to the memory cell (e.g., one or more memory cells in a page 175), identify the quantity of non-conducting bits (e.g., '0') in the data associated with the read level 305-*b* based on the sensed voltage 310-*b*, determine whether the data read (e.g., sensed voltage 310 or bit value) read from the memory cell at the read level 305-*b* was successfully decoded, and if not, generate the read level 305-*c* according to the techniques described herein with reference to the operations 215-235.

Based on calculating (e.g., obtaining) the read level 305-*c*, the memory system 110 may apply the read level 305-*c* to the memory cell (e.g., one or more memory cells in a page 175), identify the quantity of non-conducting bits in the data associated with the read level 305-*c* based on the sensed voltage 310-*c*, determine whether the data read (e.g., sensed voltage 310 or bit value) read from the memory cell (e.g., one or more memory cells in a page 175) at the read level 305-*c* was successfully decoded, and if not, generate the read level 305-*d* according to the techniques described herein with reference to the operations 215-235.

Based on calculating (e.g., obtaining) the read level 305-*d*, the memory system 110 may apply the read level 305-*d* to the memory cell (e.g., one or more memory cells in a page 175), identify the quantity of non-conducting bits in the data associated with the read level 305-*d* based on the sensed voltage 310-*d*, determine whether the data read (e.g., sensed voltage 310 or bit value) read from the memory cell (e.g., one or more memory cells in a page 175) at the read level 305-*d* was successfully decoded, and if not, generate the read level 305-*e* according to the techniques described herein with reference to the operations 215-350.

As such, the memory system 110 may apply the read level 305-*e* and successfully recover (e.g., decode or obtain) the data from the memory cell (e.g., one or more memory cells in a page 175). By utilizing the techniques described herein, the memory system 110 may incrementally adjust the read levels 305 according to information associated with previous read levels, which may enable the memory system 110 to avoid overshooting the read level 305-*e* (e.g., accurate read level), minimize redundancy in the error handling flow, increase reliability in the error handling flow, and reduce the impact of noise generated during error handling flows (e.g., due to CFBit), among other advantages.

That is, the techniques described herein may improve the reliability of error handling, while also reducing the affects of noise on the error handling procedure, by adjusting the read level 305 according to a calculated gradient, which takes into account the quantity of bit flips between consecutive read levels and the change between the consecutive read levels. For example, obtaining the quantity of non-conducting bits (e.g., CFBit count or quantity of '0' within the data) may be susceptible to noise due to various reasons, such as bias of a voltage regulator or pump that outputs a sensed voltage 310 with an unexpected bias, various circuitry flaws (e.g., CFBit circuit and sensing circuit inaccuracies), environmental factors (e.g., temperature, electromagnetic field, among other examples). However, the memory system 110 may reduce (e.g., smoothen) the noise in the error handling procedure by utilizing the techniques described herein, thereby reducing the overshoot of the read levels 305, reducing the likelihood of converging on an incorrect.

Figure 4:
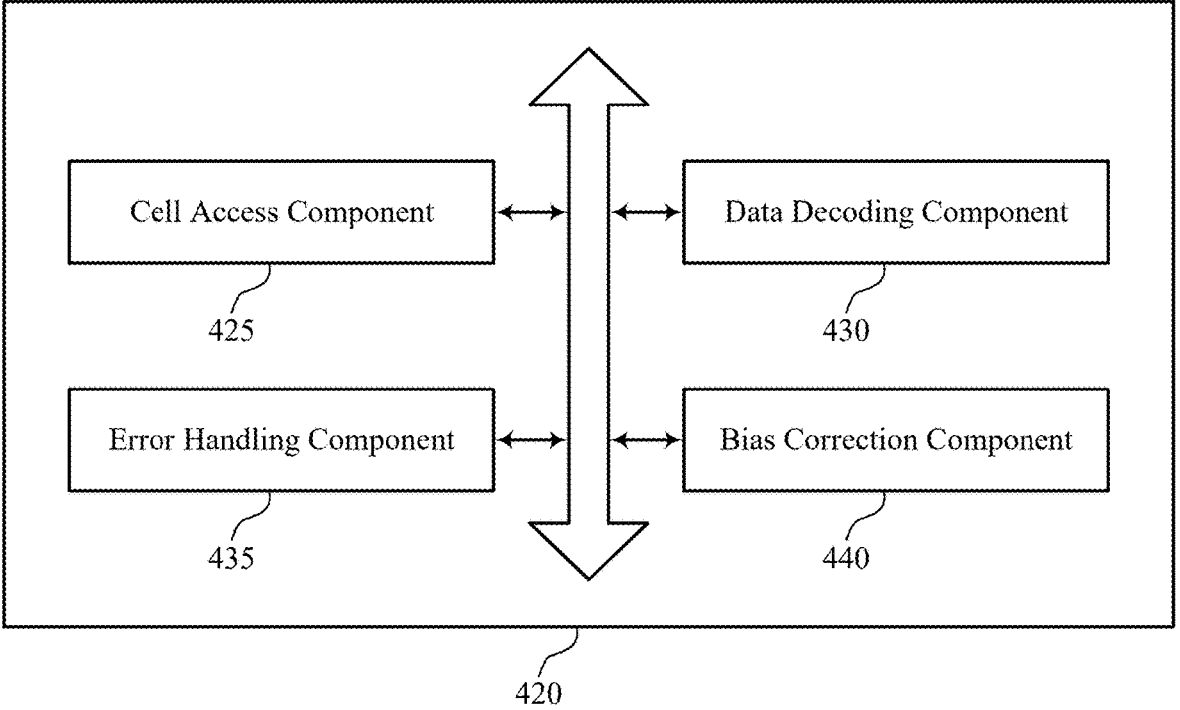
FIG. 4 shows a block diagram of a memory system that supports enhanced error handling in memory systems in accordance with examples as disclosed herein.

FIG. 4 shows a block diagram 400 of a memory system 420 that supports enhanced error handling in memory systems in accordance with examples as disclosed herein. The memory system 420 may be an example of aspects of a memory system as described with reference to FIGS. 1 through 3. The memory system 420, or various components thereof, may be an example of means for performing various aspects of enhanced error handling in memory systems as described herein. For example, the memory system 420 may include a cell access component 425, a data decoding component 430, an error handling component 435, a bias correction component 440, or any combination thereof. Each of these components, or components of subcomponents thereof (e.g., one or more processors, one or more memories), may communicate, directly or indirectly, with one another (e.g., via one or more buses).

The memory system 420 may support operating a memory system in accordance with examples as disclosed herein. The cell access component 425 may be configured as or otherwise support a means for reading, during an error handling procedure, data from a memory cell according to a first read level. In some examples, the cell access component 425 may be configured as or otherwise support a means for reading, during the error handling procedure, the data from the memory cell according to a second read level, where the second read level is based at least in part on the first read level, a first learning rate parameter, and a first momentum parameter. In some examples, the cell access component 425 may be configured as or otherwise support a means for reading, during the error handling procedure, the data from the memory cell according to a third read level, where the third read level is based at least in part on the second read level, a second learning rate parameter, and a second momentum parameter. The data decoding component 430 may be configured as or otherwise support a means for determining whether to exit the error handling procedure or continue the error handling procedure based at least in part on reading the data from the memory cell according to the second read level and the third read level.

In some examples, the error handling component 435 may be configured as or otherwise support a means for initializing the error handling procedure based at least in part on a failure to obtain the data from the memory cell, where reading the data from the memory cell according to the first read level is based at least in part on initializing the error handling procedure.

In some examples, the error handling component 435 may be configured as or otherwise support a means for exiting the error handling procedure based at least in part on successfully reading the data from the memory cell according to the second read level and the third read level.

In some examples, the data decoding component 430 may be configured as or otherwise support a means for determining, based at least in part on reading the data from the memory cell according to the third read level, that the data was unsuccessfully read from the memory cell. In some examples, the cell access component 425 may be configured as or otherwise support a means for reading, based at least in part on determining the data was unsuccessfully read, the data from the memory cell according to a fourth read level, where the fourth read level is based at least in part on the third read level, a third momentum parameter, and a third learning rate parameter, where exiting the error handling procedure is based at least in part on successfully reading the data from the memory cell according to the fourth read level.

In some examples, the cell access component 425 may be configured as or otherwise support a means for reading, during the error handling procedure, the data from the memory cell according to a plurality of read levels to identify a voltage valley associated with the data at the memory cell, the plurality of read levels including the first read level, where reading the data from the memory cell according to the second read level is based at least in part on identifying the voltage valley associated with the data.

In some examples, the bias correction component 440 may be configured as or otherwise support a means for performing a first bias correction operation to obtain the first learning rate parameter, the first momentum parameter, or both, where reading the data from the memory cell according to the second read level is based at least in part on performing the first bias correction operation. In some examples, the bias correction component 440 may be configured as or otherwise support a means for performing a second bias correction operation to obtain the second learning rate parameter, the second momentum parameter, or both, where reading the data from the memory cell according to the third read level is based at least in part on performing the second bias correction operation.

In some examples, the second read level is based at least in part on a difference between the first read level and any combination of the first learning rate parameter and the first momentum parameter, and the third read level is based at least in part on a difference between the second read level and any combination of the second learning rate parameter and the second momentum parameter.

In some examples, the first momentum parameter is based at least in part on a decay rate parameter, a third momentum parameter associated with the first read level, and a first gradient parameter, or any combination thereof, and the second momentum parameter is based at least in part on the decay rate parameter, the first momentum parameter, and a second gradient parameter, or any combination thereof.

In some examples, the second gradient parameter is based at least in part on a difference between a first quantity of non-conducting bits that occurred in data read from the memory cell according to the first read level to the memory cell and a second quantity of non-conducting bits that occurred in data read from the memory cell according to the second read level and a difference between the first read level and the second read level.

In some examples, the first learning rate parameter is based at least in part on a step size value, a first squared gradient parameter, an epsilon parameter, or any combination thereof, and the second learning rate parameter is based at least in part on the step size value, a second squared gradient parameter, the epsilon parameter, or any combination thereof.

In some examples, the first read level, the second read level, and the third read level correspond to respective read voltages that are applied to the memory cell.

In some examples, the memory cell is a multi-level cell (MLC), a tertiary level cell (TLC), or a quad level cell (QLC).

In some examples, the memory cell is a not AND (NAND) memory cell.

In some examples, the described functionality of the memory system 420, or various components thereof, may be supported by or may refer to at least a portion of at least one processor, where such at least one processor may include one or more processing elements (e.g., a controller, a microprocessor, a microcontroller, a digital signal processor, a state machine, discrete gate logic, discrete transistor logic, discrete hardware components, or any combination of one or more of such elements). In some examples, the described functionality of the memory system 420, or various components thereof, may be implemented at least in part by instructions (e.g., stored in memory, non-transitory computer-readable medium) executable by such at least one processor.

FIG. 5 shows a flowchart illustrating a method 500 that supports enhanced error handling in memory systems in accordance with examples as disclosed herein. The operations of method 500 may be implemented by a memory system or its components as described herein. For example, the operations of method 500 may be performed by a memory system as described with reference to FIGS. 1 through 4. In some examples, a memory system may execute a set of instructions to control the functional elements of the device to perform the described functions. Additionally, or alternatively, the memory system may perform aspects of the described functions using special-purpose hardware.

At 505, the method may include reading, during an error handling procedure, data from a memory cell according to a first read level. In some examples, aspects of the operations of 505 may be performed by a cell access component 425 as described with reference to FIG. 4.

At 510, the method may include reading, during the error handling procedure, the data from the memory cell according to a second read level, where the second read level is based at least in part on the first read level, a first learning rate parameter, and a first momentum parameter. In some examples, aspects of the operations of 510 may be performed by a cell access component 425 as described with reference to FIG. 4.

At 515, the method may include reading, during the error handling procedure, the data from the memory cell according to a third read level, where the third read level is based at least in part on the second read level, a second learning rate parameter, and a second momentum parameter. In some examples, aspects of the operations of 515 may be performed by a cell access component 425 as described with reference to FIG. 4.

At 520, the method may include determining whether to exit the error handling procedure or continue the error handling procedure based at least in part on reading the data from the memory cell according to the second read level and the third read level. In some examples, aspects of the operations of 520 may be performed by a data decoding component 430 as described with reference to FIG. 4.

In some examples, an apparatus as described herein may perform a method or methods, such as the method 500. The apparatus may include features, circuitry, logic, means, or instructions (e.g., a non-transitory computer-readable medium storing instructions executable by a processor), or any combination thereof for performing the following aspects of the present disclosure:

Aspect 1: A method, apparatus, or non-transitory computer-readable medium including operations, features, circuitry, logic, means, or instructions, or any combination thereof for reading, during an error handling procedure, data from a memory cell according to a first read level; reading, during the error handling procedure, the data from the memory cell according to a second read level, where the second read level is based at least in part on the first read level, a first learning rate parameter, and a first momentum parameter; reading, during the error handling procedure, the data from the memory cell according to a third read level, where the third read level is based at least in part on the second read level, a second learning rate parameter, and a second momentum parameter; and determining whether to exit the error handling procedure or continue the error handling procedure based at least in part on reading the data from the memory cell according to the second read level and the third read level.

Aspect 2: The method, apparatus, or non-transitory computer-readable medium of aspect 1, further including operations, features, circuitry, logic, means, or instructions, or any combination thereof for initializing the error handling procedure based at least in part on a failure to obtain the data from the memory cell, where reading the data from the memory cell according to the first read level is based at least in part on initializing the error handling procedure.

Aspect 3: The method, apparatus, or non-transitory computer-readable medium of any of aspects 1 through 2, further including operations, features, circuitry, logic, means, or instructions, or any combination thereof for exiting the error handling procedure based at least in part on successfully reading the data from the memory cell according to the second read level and the third read level.

Aspect 4: The method, apparatus, or non-transitory computer-readable medium of any of aspects 1 through 3, further including operations, features, circuitry, logic, means, or instructions, or any combination thereof for determining, based at least in part on reading the data from the memory cell according to the third read level, that the data was unsuccessfully read from the memory cell and reading, based at least in part on determining the data was unsuccessfully read, the data from the memory cell according to a fourth read level, where the fourth read level is based at least in part on the third read level, a third momentum parameter, and a third learning rate parameter, where exiting the error handling procedure is based at least in part on successfully reading the data from the memory cell according to the fourth read level.

Aspect 5: The method, apparatus, or non-transitory computer-readable medium of any of aspects 1 through 4, further including operations, features, circuitry, logic, means, or instructions, or any combination thereof for reading, during the error handling procedure, the data from the memory cell according to a plurality of read levels to identify a voltage valley associated with the data at the memory cell, the plurality of read levels including the first read level, where reading the data from the memory cell according to the second read level is based at least in part on identifying the voltage valley associated with the data.

Aspect 6: The method, apparatus, or non-transitory computer-readable medium of any of aspects 1 through 5, further including operations, features, circuitry, logic, means, or instructions, or any combination thereof for performing a first bias correction operation to obtain the first learning rate parameter, the first momentum parameter, or both, where reading the data from the memory cell according to the second read level is based at least in part on performing the first bias correction operation and performing a second bias correction operation to obtain the second learning rate parameter, the second momentum parameter, or both, where reading the data from the memory cell according to the third read level is based at least in part on performing the second bias correction operation.

Aspect 7: The method, apparatus, or non-transitory computer-readable medium of any of aspects 1 through 6, where the second read level is based at least in part on a difference between the first read level and any combination of the first learning rate parameter and the first momentum parameter, and the third read level is based at least in part on a difference between the second read level and any combination of the second learning rate parameter and the second momentum parameter.

Aspect 8: The method, apparatus, or non-transitory computer-readable medium of any of aspects 1 through 7, where the first momentum parameter is based at least in part on a decay rate parameter, a third momentum parameter associated with the first read level, and a first gradient parameter, or any combination thereof, and the second momentum parameter is based at least in part on the decay rate parameter, the first momentum parameter, and a second gradient parameter, or any combination thereof.

Aspect 9: The method, apparatus, or non-transitory computer-readable medium of aspect 8, where the second gradient parameter is based at least in part on a difference between a first quantity of non-conducting bits that occurred in data read from the memory cell according to the first read level to the memory cell and a second quantity of non-conducting bits that occurred in data read from the memory cell according to the second read level and a difference between the first read level and the second read level.

Aspect 10: The method, apparatus, or non-transitory computer-readable medium of any of aspects 1 through 9, where the first learning rate parameter is based at least in part on a step size value, a first squared gradient parameter, an epsilon parameter, or any combination thereof, and the second learning rate parameter is based at least in part on the step size value, a second squared gradient parameter, the epsilon parameter, or any combination thereof.

Aspect 11: The method, apparatus, or non-transitory computer-readable medium of any of aspects 1 through 10, where the first read level, the second read level, and the third read level correspond to respective read voltages that are applied to the memory cell.

Aspect 12: The method, apparatus, or non-transitory computer-readable medium of any of aspects 1 through 11, where the memory cell is a multi-level cell (MLC), a tertiary level cell (TLC), or a quad level cell (QLC).

Aspect 13: The method, apparatus, or non-transitory computer-readable medium of any of aspects 1 through 12, where the memory cell is a not AND (NAND) memory cell.

It should be noted that the described techniques include possible implementations, and that the operations and the steps may be rearranged or otherwise modified and that other implementations are possible. Further, portions from two or more of the methods may be combined.

Information and signals described herein may be represented using any of a variety of different technologies and techniques. For example, data, instructions, commands, information, signals, bits, or symbols of signaling that may be referenced throughout the above description may be represented by voltages, currents, electromagnetic waves, magnetic fields or particles, optical fields or particles, or any combination thereof. Some drawings may illustrate signals as a single signal; however, the signal may represent a bus of signals, where the bus may have a variety of bit widths.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some examples, the flow of signals between the connected components may be interrupted for a time, for example, using one or more intermediate components such as switches or transistors.

The term "coupling" (e.g., "electrically coupling") may refer to a condition of moving from an open-circuit relationship between components in which signals are not presently capable of being communicated between the components over a conductive path to a closed-circuit relationship between components in which signals are capable of being communicated between components over the conductive path. If a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other if the switch is open. If a controller isolates two components, the controller affects a change that prevents signals from flowing between the components using a conductive path that previously permitted signals to flow.

The terms "if," "when," "based on," or "based at least in part on" may be used interchangeably. In some examples, if the terms "if," "when," "based on," or "based at least in part on" are used to describe a conditional action, a conditional process, or connection between portions of a process, the terms may be interchangeable.

The term "in response to" may refer to one condition or action occurring at least partially, if not fully, as a result of a previous condition or action. For example, a first condition or action may be performed, and a second condition or action may at least partially occur as a result of the previous condition or action occurring (whether directly after or after one or more other intermediate conditions or actions occurring after the first condition or action).

Additionally, the terms "directly in response to" or "in direct response to" may refer to one condition or action occurring as a direct result of a previous condition or action. In some examples, a first condition or action may be performed, and a second condition or action may occur directly as a result of the previous condition or action occurring independent of whether other conditions or actions occur. In some examples, a first condition or action may be performed, and a second condition or action may occur directly as a result of the previous condition or action occurring, such that no other intermediate conditions or actions occur between the earlier condition or action and the second condition or action or a limited quantity of one or more intermediate steps or actions occur between the earlier condition or action and the second condition or action. Any condition or action described herein as being performed "based on," "based at least in part on," or "in response to" some other step, action, event, or condition may additionally, or alternatively (e.g., in an alternative example), be performed "in direct response to" or "directly in response to" such other condition or action unless otherwise specified.

The devices discussed herein, including a memory array, may be formed on a semiconductor substrate, such as silicon, germanium, silicon-germanium alloy, gallium arsenide, gallium nitride, etc. In some examples, the substrate is a semiconductor wafer. In some other examples, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorus, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as an n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" if a voltage greater than or equal to the transistor's threshold voltage is applied to the transistor gate. The transistor may be "off" or "deactivated" if a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration" and not "preferred" or "advantageous over other examples." The detailed description includes specific details to provide an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a hyphen and a second label that distinguishes among the similar components. If just the first reference label is used in the specification, the description is applicable to any one of the similar components having the same first reference label irrespective of the second reference label.

The functions described herein may be implemented in hardware, software executed by a processing system (e.g., one or more processors, one or more controllers, control circuitry, processing circuitry, logic circuitry), firmware, or any combination thereof. If implemented in software executed by a processing system, the functions may be stored on or transmitted over as one or more instructions (e.g., code) on a computer-readable medium. Due to the nature of software, functions described herein can be implemented using software executed by a processing system, hardware, firmware, hardwiring, or combinations of any of these. Features implementing functions may be physically located at various positions, including being distributed such that portions of functions are implemented at different physical locations.

Illustrative blocks and modules described herein may be implemented or performed with one or more processors, such as a DSP, an ASIC, an FPGA, discrete gate logic, discrete transistor logic, discrete hardware components, other programmable logic device, or any combination thereof designed to perform the functions described herein. A processor may be an example of a microprocessor, a controller, a microcontroller, a state machine, or other types of processors. A processor may also be implemented as at least one of one or more computing devices (e.g., a combination of a DSP and a microprocessor, multiple microprocessors, one or more microprocessors in conjunction with a DSP core, or any other such configuration).

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

As used herein, including in the claims, the article "a" before a noun is open-ended and understood to refer to "at least one" of those nouns or "one or more" of those nouns. Thus, the terms "a," "at least one," "one or more," "at least one of one or more" may be interchangeable. For example, if a claim recites "a component" that performs one or more functions, each of the individual functions may be performed by a single component or by any combination of multiple components. Thus, the term "a component" having characteristics or performing functions may refer to "at least one of one or more components" having a particular characteristic or performing a particular function. Subsequent reference to a component introduced with the article "a" using the terms "the" or "said" may refer to any or all of the one or more components. For example, a component introduced with the article "a" may be understood to mean "one or more components," and referring to "the component" subsequently in the claims may be understood to be equivalent to referring to "at least one of the one or more components." Similarly, subsequent reference to a component introduced as "one or more components" using the terms "the" or "said" may refer to any or all of the one or more components. For example, referring to "the one or more components" subsequently in the claims may be understood to be equivalent to referring to "at least one of the one or more components."

Computer-readable media includes both non-transitory computer storage media and communication media including any medium that facilitates transfer of a computer program from one place to another. A non-transitory storage medium may be any available medium, or combination of multiple media, which can be accessed by a computer. By way of example, and not limitation, non-transitory computer-readable media can comprise RAM, ROM, electrically erasable programmable read-only memory (EEPROM), optical disk storage, magnetic disk storage or other magnetic storage devices, or any other non-transitory medium or combination of media that can be used to carry or store desired program code means in the form of instructions or data structures and that can be accessed by a computer, or one or more processors.

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein but is to be accorded the broadest scope consistent with the principles and novel features disclosed herein.

What is claimed is:

1. A memory system, comprising:
one or more memory devices; and
processing circuitry coupled with the one or more memory devices and configured to cause the memory system to:
read, during an error handling procedure, data from a memory cell according to a first read level;
read, during the error handling procedure, the data from the memory cell according to a second read level, wherein the second read level is based at least in part on a difference between the first read level and a product of a first learning rate parameter and a first momentum parameter;
read, during the error handling procedure, the data from the memory cell according to a third read level, wherein the third read level is based at least in part on a difference between the second read level and a product of a second learning rate parameter and a second momentum parameter; and
determine whether to exit the error handling procedure or continue the error handling procedure based at least in part on reading the data from the memory cell according to the second read level and the third read level.

2. The memory system of claim 1, wherein the processing circuitry is further configured to cause the memory system to:

initialize the error handling procedure based at least in part on a failure to obtain the data from the memory cell, wherein reading the data from the memory cell according to the first read level is based at least in part on initializing the error handling procedure.

3. The memory system of claim 1, wherein the processing circuitry is further configured to cause the memory system to:

exit the error handling procedure based at least in part on successfully reading the data from the memory cell according to the second read level and the third read level.

4. The memory system of claim 1, wherein the processing circuitry is further configured to cause the memory system to:

determine, based at least in part on reading the data from the memory cell according to the third read level, that the data was unsuccessfully read from the memory cell; and read, based at least in part on determining the data was unsuccessfully read, the data from the memory cell according to a fourth read level, wherein the fourth read level is based at least in part on the third read level, a third momentum parameter, and a third learning rate parameter, wherein exiting the error handling procedure is based at least in part on successfully reading the data from the memory cell according to the fourth read level.

5. The memory system of claim 1, wherein the processing circuitry is further configured to cause the memory system to:

read, during the error handling procedure, the data from the memory cell according to a plurality of read levels to identify a voltage valley associated with the data at the memory cell, the plurality of read levels including the first read level, wherein reading the data from the memory cell according to the second read level is based at least in part on identifying the voltage valley associated with the data.

6. The memory system of claim 1, wherein the processing circuitry is further configured to cause the memory system to:

perform a first bias correction operation to obtain the first learning rate parameter, the first momentum parameter, or both, wherein reading the data from the memory cell according to the second read level is based at least in part on performing the first bias correction operation; and perform a second bias correction operation to obtain the second learning rate parameter, the second momentum parameter, or both, wherein reading the data from the memory cell according to the third read level is based at least in part on performing the second bias correction operation.

7. The memory system of claim 1, wherein:

the first momentum parameter is based at least in part on a decay rate parameter, a third momentum parameter associated with the first read level, and a first gradient parameter, or any combination thereof, and the second momentum parameter is based at least in part on the decay rate parameter, the first momentum parameter, and a second gradient parameter, or any combination thereof.

8. The memory system of claim 7, wherein the second gradient parameter is based at least in part on a difference between a first quantity of non-conducting bits that occurred in data read from the memory cell according to the first read level to the memory cell and a second quantity of non-conducting bits that occurred in data read from the memory cell according to the second read level and a difference between the first read level and the second read level.

9. The memory system of claim 1, wherein:

the first learning rate parameter is based at least in part on a step size value, a first squared gradient parameter, and an epsilon parameter, and the second learning rate parameter is based at least in part on the step size value, a second squared gradient parameter, and the epsilon parameter.

10. The memory system of claim 1, wherein the first read level, the second read level, and the third read level correspond to respective read voltages that are applied to the memory cell.

11. The memory system of claim 1, wherein the memory cell is a multi-level cell (MLC), a tertiary level cell (TLC), or a quad level cell (QLC).

12. The memory system of claim 1, wherein the memory cell is a not AND (NAND) memory cell.

13. A method for operating a memory system, comprising:

reading, during an error handling procedure, data from a memory cell according to a first read level;

reading, during the error handling procedure, the data from the memory cell according to a second read level, wherein the second read level is based at least in part on a difference between the first read level and a product of a first learning rate parameter and a first momentum parameter;

reading, during the error handling procedure, the data from the memory cell according to a third read level, wherein the third read level is based at least in part on a difference between the second read level and a product of a second learning rate parameter and a second momentum parameter; and determining whether to exit the error handling procedure or continue the error handling procedure based at least in part on reading the data from the memory cell according to the second read level and the third read level.

14. The method of claim 13, further comprising:

initializing the error handling procedure based at least in part on a failure to obtain the data from the memory cell, wherein reading the data from the memory cell according to the first read level is based at least in part on initializing the error handling procedure.

15. The method of claim 4, further comprising:

exiting the error handling procedure based at least in part on successfully reading the data from the memory cell according to the second read level and the third read level.

16. The method of claim 13, further comprising:

determining, based at least in part on reading the data from the memory cell according to the third read level, that the data was unsuccessfully read from the memory cell; and reading, based at least in part on determining the data was unsuccessfully read, the data from the memory cell according to a fourth read level, wherein the fourth read level is based at least in part on the third read level, a third momentum parameter, and a third learning rate parameter, wherein exiting the error handling procedure is based at least in part on successfully reading the data from the memory cell according to the fourth read level.

17. The method of claim 13, further comprising:

reading, during the error handling procedure, the data from the memory cell according to a plurality of read levels to identify a voltage valley associated with the data at the memory cell, the plurality of read levels including the first read level, wherein reading the data from the memory cell according to the second read level is based at least in part on identifying the voltage valley associated with the data.

18. The method of claim 13, further comprising:

performing a first bias correction operation to obtain the first learning rate parameter, the first momentum parameter, or both, wherein reading the data from the memory cell according to the second read level is based at least in part on performing the first bias correction operation; and performing a second bias correction operation to obtain the second learning rate parameter, the second momentum parameter, or both, wherein reading the data from the memory cell according to the third read level is based at least in part on performing the second bias correction operation.

19. The method of claim 13, wherein:

the first momentum parameter is based at least in part on a decay rate parameter, a third momentum parameter associated with the first read level, and a first gradient parameter, or any combination thereof, and the second momentum parameter is based at least in part on the decay rate parameter, the first momentum parameter, and a second gradient parameter, or any combination thereof.

20. The method of claim 19, wherein the second gradient parameter is based at least in part on a difference between a first quantity of bit flips that occurred in data read from the memory cell according to the first read level to the memory cell and a second quantity of bit flips that occurred in data read from the memory cell according to the second read level and a difference between the first read level and the second read level.

21. A non-transitory computer-readable medium storing code for operating a memory system, the code comprising instructions executable by one or more processors to:

read, during an error handling procedure, data from a memory cell according to a first read level;

read, during the error handling procedure, the data from the memory cell according to a second read level, wherein the second read level is based at least in part on a difference between the first read level and a product of a first learning rate parameter and a first momentum parameter;

read, during the error handling procedure, the data from the memory cell according to a third read level, wherein the third read level is based at least in part on a difference between the second read level and a product of a second learning rate parameter and a second momentum parameter; and determine whether to exit the error handling procedure or continue the error handling procedure based at least in part on reading the data from the memory cell according to the second read level and the third read level.

* * * * *